United States Patent
Tada et al.

(10) Patent No.: US 7,506,291 B2
(45) Date of Patent: Mar. 17, 2009

(54) TEST EMULATOR, EMULATION PROGRAM AND METHOD FOR MANUFACTURING SEMICONDUCTOR DEVICE

(75) Inventors: Hideki Tada, Tokyo (JP); Mitsuo Hori, Tokyo (JP); Takahiro Kataoka, Tokyo (JP)

(73) Assignee: Advantest Corporation, Tokyo (JP)

( * ) Notice: Subject to any disclaimer, the term of this patent is extended or adjusted under 35 U.S.C. 154(b) by 453 days.

(21) Appl. No.: 11/211,126

(22) Filed: Aug. 24, 2005

(65) Prior Publication Data

US 2006/0064607 A1    Mar. 23, 2006

Related U.S. Application Data

(63) Continuation of application No. PCT/JP2005/014923, filed on Aug. 15, 2005.

(30) Foreign Application Priority Data

Aug. 17, 2004   (JP)  .............................. 2004-237758

(51) Int. Cl.
*G06F 17/50* (2006.01)
*G06F 9/45* (2006.01)

(52) U.S. Cl. .............................................. 716/6; 716/4

(58) Field of Classification Search ............ 716/4, 716/6

See application file for complete search history.

(56) References Cited

U.S. PATENT DOCUMENTS

| | | | |
|---|---|---|---|
| 5,794,008 A | * | 8/1998 | Meyers et al. .................. 716/4 |
| 6,308,292 B1 | | 10/2001 | Fusco |
| 6,370,675 B1 | | 4/2002 | Matsumura et al. |

FOREIGN PATENT DOCUMENTS

| | | |
|---|---|---|
| JP | 03245072 | 10/1991 |
| JP | 11237440 | 8/1999 |
| JP | 2001255357 | 9/2001 |
| JP | 2002-14140 | 1/2002 |
| JP | 2002-215712 | 8/2002 |
| JP | 2004-192315 | 7/2004 |

OTHER PUBLICATIONS

PCT International Search Report issued for International application No. PCT/JP2005/014923 mailed on Nov. 29, 2005, 2 pages.
Patent Abstracts of Japan, Publication No. 2002-215712, Publication Date: Aug. 2, 2002, 2 pages.
Extended European Search Report issued in EP Application No. 05780198.7 dated Jun. 23, 2008 (3 pages).

\* cited by examiner

*Primary Examiner*—Jack Chiang
*Assistant Examiner*—Suresh Memula
(74) *Attorney, Agent, or Firm*—Osha - Liang LLP (57) ABSTRACT

A test emulator for emulating a test of a semiconductor device is provided. The test emulator includes a test pattern providing means for providing a test pattern to a device simulator which simulates the operation of a semiconductor device, an expected value storage means for associating a comparison timing at which an output signal outputted from the device simulator according to the test pattern is compared with an predetermined expected value with the expected value at the comparison timing and previously storing therein the same, a margin determination means for determining the size of a margin between which the output signal corresponds to the expected value when the output signal corresponds to the expected value at the comparison timing and a notification means for notifying a user that the margin at the comparison timing is small when the size of margin is smaller than a reference value.

17 Claims, 5 Drawing Sheets

TEST EMULATOR, EMULATION PROGRAM AND METHOD FOR MANUFACTURING SEMICONDUCTOR DEVICE

CROSS REFERENCE TO RELATED APPLICATION

This is a continuation application of PCT/JP2005/014923 filed on Aug. 15, 2005 which claims priority from a Japanese Patent Application No. 2004-237758 filed on Aug. 17, 2004, the contents of which are incorporated herein by reference.

BACKGROUND OF THE INVENTION

1. Field of the Invention

The present invention relates to a test emulator, an emulation program and a method of manufacturing a semiconductor device. Particularly, the present invention relates to a test emulator for emulating a test of a semiconductor device, an emulation program and a method of manufacturing a semiconductor device.

2. Related Art

Recently, semiconductor devices such as VLSIs are designed in hardware description language (HDL) such as Verilog-HDL and VHDL using computers. Such design in HDL is verified whether a function intended by the designer is performed using a simulator (Verilog-HDL/VHDL simulator) at behavioral level and gate level before it is manufactured as a silicon IC.

For example, a technology for emulating a test of a semiconductor device by a semiconductor test apparatus to verify the design of the semiconductor device has been disclosed as disclosed, for example, in Japanese Patent Unexamined Publication No. 2002-215712.

However, the semiconductor device used in the emulated test is merely an ideal device of which behavior is simulated based on the HDL. Accordingly, the test result of the simulated semiconductor device may not correspond to that of an actual semiconductor device. The test result of the simulated semiconductor device may not correspond to that of an actual semiconductor device even if output signals are compared with a reference value at the same timing as each other because the leading timing of the output signal of the simulated semiconductor device is different from that of the actual semiconductor device or and the leading edge of the output signal of the actual semiconductor device is not sharp. That is to say, the simulated semiconductor device has passed the emulated test, but the semiconductor device manufactured as the silicon IC may not pass a test conducted by the semiconductor test apparatus.

To emulate a test using a simulator based on the HDL is essentially expected an effect to manufacture semiconductor devices at lower cost without repeatedly manufacturing experimental chips and modifying the design. However, since the accuracy of the emulated test has not been sufficient before, any satisfactory effect has not been obtained.

SUMMARY OF THE INVENTION

Thus, the object of the present invention is to provide a test emulator, an emulation program and a method of manufacturing a semiconductor device being capable of solving the above-described problems. This object is achieved by combining the features recited in independent claims. Then, dependent claims define further effective specific examples of the present invention.

To solve the above-described problem, a test emulator for emulating a test of a semiconductor device according to a first embodiment of the present invention includes a test pattern providing means for providing a test pattern to a device simulator which simulates the operation of a semiconductor device, an expected value storage means for associating a comparison timing at which an output signal outputted from the device simulator according to the test pattern is compared with an predetermined expected value with the expected value at the comparison timing and previously storing therein the same, a margin determination means for determining the size of a margin between which the output signal corresponds to the expected value when the output signal corresponds to the expected value at the comparison timing and a notification means for notifying a user that the margin at the comparison timing is small when the size of margin is smaller than a reference value.

The margin determination means may determine the size of a margin during which the output signal corresponds to the expected value centered around the comparison timing. The expected value storage means associates a plurality of comparison timings with each expected value of the plurality of comparison timings and stores therein the same. The notification means may notify the user of the predetermined number of comparison timings with the smallest margin. The margin determination means may determine the size of a margin between which the output signal level and a reference voltage level defined as the expected value. The margin determination means may determine the size of a margin between which the output signal level and the reference voltage level defined as the expected value at a timing away from the comparison timing by a predetermined period. The notification means may use values different for each output terminal of the semiconductor device as the reference value. The notification means may use values different for each test period. The test emulator further includes an output signal display means for displaying output signals. The notification means may indicate a comparison timing with a small margin on the output signal displayed on the output signal display means.

The test emulator further includes a timing setting means for setting a test pattern and a comparison timing as an elapsed time from changing the test pattern or an output signal and a timing converting means for converting the elapsed time from the change to times in each test cycle used when an actual semiconductor device is tested by an actual semiconductor test apparatus. The test pattern providing means may provide a test pattern at the time in the test cycle converted by the timing converting means. The margin determination means may determine the size of a margin if the output signal corresponds to the expected value at the comparison timing converted by the timing converting means.

Additionally, in a second embodiment of the present invention, an emulation program for operating a computer to function as a test emulator for emulating a test of a semiconductor device is provided. The emulation program operates a computer to function as the test emulator including a test pattern providing means for providing a test pattern to a device simulator which simulates the operation of a semiconductor device, an expected value storage means for associating a comparison timing at which an output signal outputted from the device simulator according to the test pattern is compared with an predetermined expected value with the expected value at the comparison timing and previously storing the same, a margin determination means for determining the size of a margin between which the output signal corresponds to the expected value when the output signal corresponds to the expected value at the comparison timing and a notification means for notifying a user that the margin at the comparison timing is small when the size of margin is smaller than a reference value.

The margin determination means may determine a size of margin during which the output signal corresponds to the expected value centered around the comparison timing. The expected value storage means associates a plurality of comparison timings with each expected value of the plurality of comparison timings and stores therein the same. The notification means may notify the user of the predetermined number of comparison timings with the smallest margin. The margin determination means may determine the size of a margin between which the output signal level and a reference voltage level defined as the expected value. The margin determination means may determine the size of a margin between which the output signal level and the reference voltage level defined as the expected value at a timing away from the comparison timing by a predetermined period. The notification means may use values different for each output terminal of the semiconductor device as the reference value. The notification means may use values different for each test period. The test emulator further includes an output signal display means for displaying output signals. The notification means may indicate a comparison timing with a small margin on the output signal displayed on the output signal display means.

Further in a third embodiment of the present invention, a method of manufacturing a semiconductor device is provided. The method of the manufacturing a semiconductor device includes a circuit design step for designing a circuit of the semiconductor device, a test pattern setting step for setting a test pattern supplied to the semiconductor device, an expected value setting step for associating a comparison timing at which an output signal obtained from the semiconductor device when the test pattern is supplied with a predetermined expected value with the expected value at the comparison timing and setting it, an output storage step for causing a computer to simulate the operation of the semiconductor device designed in the circuit design step while the test pattern is supplied to the semiconductor device simulated by the computer to calculate the output signal to output from the semiconductor device and store the same, a comparison step for comparing the output signal stored in the output storage step with the expected value at the comparison timing set in the expected value setting step, a margin determination step for determining the size of a margin between which the output signal corresponds to the expected value when the output signal corresponds to the expected value in the comparison step, a design change step for changing a design of the semiconductor device when the size of the margin is smaller than a reference value and a manufacture step for manufacturing the semiconductor device based on the circuit obtained in the circuit design step when the size of the margin is larger than the reference value.

The method of manufacturing a semiconductor device may further includes an actual test step for supplying the test pattern set in the test pattern setting step to the semiconductor device manufactured in the manufacture step and comparing the output signal from the semiconductor device with the expected value set in the expected value setting step to test the semiconductor device. The actual test step may compare the output signal and the expected value at higher frequency than the comparison timing with a large margin at the comparison timing with the small margin in comparison with the comparison step.

Here, all necessary features of the present invention are not listed in the summary of the invention. The sub-combinations of the features may become the invention.

According to the present invention, a highly accurate emulation test can be performed using the simulated semiconductor device.

DETAILED DESCRIPTION OF THE INVENTION

Hereinafter, the present invention will now be described through preferred embodiments. The embodiments do not limit the invention according to claims and all combinations of the features described in the embodiments are not necessarily essential to means for solving the problems of the invention.

Figure 1:
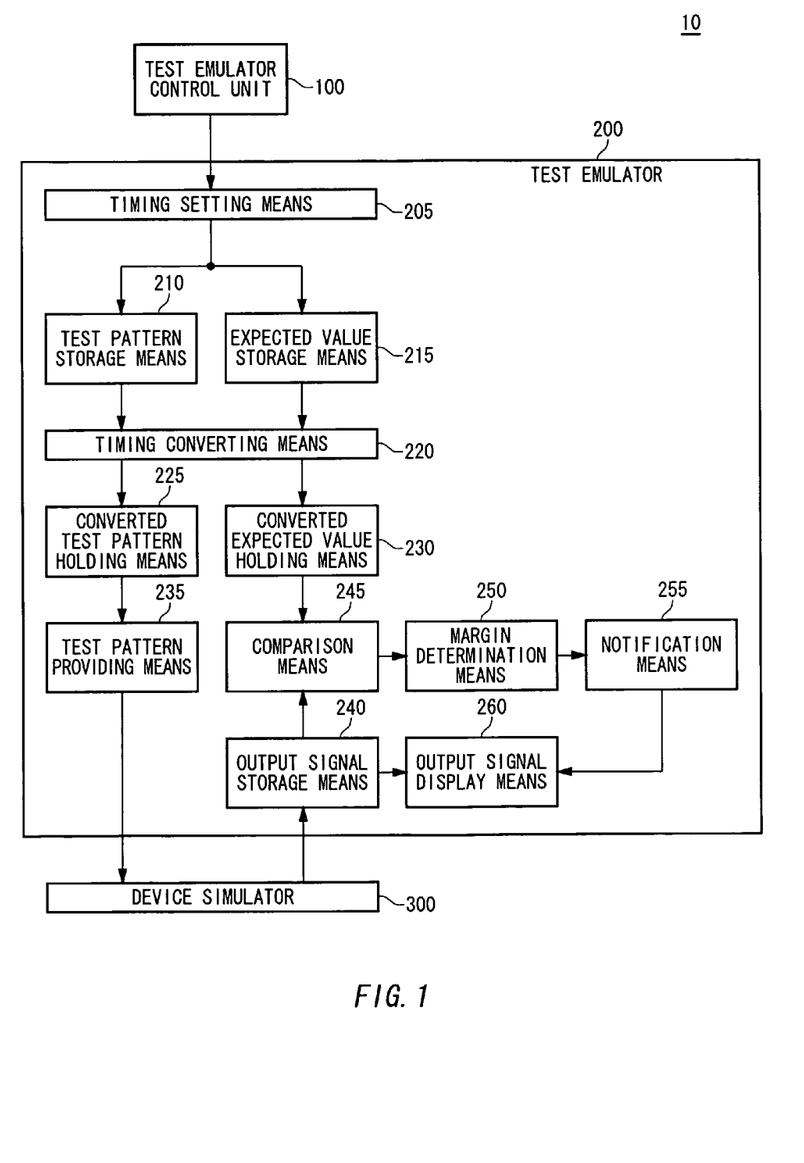
FIG. 1 is a block diagram showing an example of the configuration of a test emulation system 10 according to an embodiment of the present invention.

FIG. 1 is a block diagram showing an example of the configuration of a test emulation system 10 according to an embodiment of the present invention. The test emulation system 10 is provided with a test emulator control unit 100, a test emulator 200 and a device simulator 300. The test emulation system 10 is different from a semiconductor test apparatus for conducting functional tests using an actual semiconductor device. The test emulation system 10 conducts simulated functional tests on the device simulator for simulating the operation of a semiconductor device by a software using the test emulator 200 to emulate the test of the semiconductor device by the software so that it is determined whether the semiconductor device is good or bad.

The test emulation system 10 according to the embodiment of the present invention is intended to conduct a highly accurate emulation test even if outputted signals are different between an actual semiconductor device and the device simulator 300 for simulating the operation of the semiconductor device.

The test emulator control unit 100 controls the test emulator 200 to conduct an emulation test on the device simulator 300. Here, the test emulator control unit 100 may control the test emulator 200 based on a test program described procedures and methods of the test to be conducted on the semiconductor device which is made by user in conformity to the semiconductor device of which operation is simulated by the device simulator 300. The test program may include a test pattern supplied to the device simulator 300, the expected value of an output signal outputted by the device simulator 300 corresponding to the test pattern and a comparison timing at which the output signal is compared with the expected value when the test emulator 200 conducts simulated functional tests on the device simulator 300.

The test emulator 200 conducts simulated functional tests on the device simulator 300 for simulating the operation of a semiconductor device to emulate the test of the semiconductor device. The test emulator 200 includes a timing setting means 205, a test pattern storage means 210, an expected value storage means 215, a timing converting means 220, a converted test pattern holding means 225, a converted expected value holding means 230, a test pattern supply means 235, an output signal storage means 240, a comparison means 245, a margin determination means 250, a notification means 255 and an output signal display means 260.

The timing setting means 205 sets a test pattern supplied to the device simulator 300 and a comparison timing at which the output signal outputted from the device simulator 300 according to the test pattern is compared with a predetermined expected value based on information received from the test emulator control unit 100. Here, the timing setting means 205 sets the test pattern and the comparison timing as elapsed times from changing the previous test pattern or output signal, respectively. The timing setting means 205 may set one timing at which a signal in the test pattern leads as an elapsed time from the timing at which the signal trail just before, for example. The timing setting means 205 may set one comparison timing as an elapsed time from the timing at which the output signal rose previously, for example. Then, the timing setting means 205 outputs the set test pattern to the test pattern storage means 210 and associates the set comparison timing with an expected value previously determined by such as a test program in order to compare with the output signal at the comparison timing and outputs it to the expected storage means 215. The test pattern storage means 210 previously stores therein the test pattern set by the timing setting means 205. The expected value storage means 215 associates the comparison timing set by the timing setting means 205 to the expected value at the comparison timing and previously stores therein the same.

Now how to handle timings when an actual semiconductor device is tested by an actual semiconductor test apparatus will be described below. A test pattern is normally controlled on a time scale on the order of about 100 picoseconds. However, the time of minutes is often required in the tests of semiconductor devices. Therefore, it is not practical that the test pattern is hold as data determined on the order of about 100 picoseconds or the like because of requiring a large memory capacity. Thus, the semiconductor test apparatus associates the change of signals such as a leading edge and a trailing edge, that is to say, the type of an event and the generation timing of the event to a reference cycle of the semiconductor test apparatus and holds it as a test pattern. In other words, essentially it is preferable that the semiconductor device holds the generation timing of an event as an elapsed time from the generation timing in the event generated prior to the current event and forms the waveform of a test pattern based on the type of event and the elapsed time from the previous event. However the semiconductor test apparatus usually can not generate events such as a leading and a trailing of a test signal at any timing but generate events at only the limited timing. Specifically, the whole test period is divided into a plurality of test cycles and test sequences are controlled by each test cycle in the semiconductor device. Therefore, events can be generated at the predetermined number of timings in each test cycle. Thereby the configuration of the semiconductor device is simplified and the cost can be reduced down.

Accordingly, if the generation timing of the event is indicated as the elapsed time from the previous event, the generation timing should be converted to a timing at which an event can be generated in the test cycle. For example, the generation timing of an event may be converted to the timing proximate to the generation timing among available timings in the test cycles. Then the semiconductor test apparatus forms the waveform of a test pattern based on the converted timing and provides the formed test pattern to the semiconductor device so that the test of the semiconductor device is performed.

Meanwhile, the same processing as above is performed in the test emulator 200 according to the embodiment of the present invention. Specifically, the timing converting means 220 converts the elapsed time from changing the test pattern or the output signal at the test pattern and the comparison timing set by the timing setting means 205 to a time in the test cycle used when an actual semiconductor device is tested by an actual semiconductor apparatus. Then the timing converting means 220 outputs the converted test pattern to the converted test pattern holding means 225, associates the converted comparison timing with the expected value at the comparison timing and outputs it to the converted expected value holding means 230. The converted test pattern holding means 225 hold the test pattern, which is set by the timing setting means 205 as the elapsed time from changing in the previous test pattern, where the elapsed time from changing is converted to a time in the test cycle by the timing converting means 220. The converted expected value holding means 230 associates the comparison timing, which is set by the timing setting means 205 as the elapsed time from changing in the previous output signal, where the elapsed time from changing is converted to a time in the test cycle by the timing converting means 220, with the expected value in the comparison timing and holds therein the same The test pattern providing means 235 provides the test pattern held in the converted test pattern 225 to the device simulator 300. Specifically, the test pattern providing means 235 provides the test pattern held in the converted test pattern holding means 225 at times in the test cycle converted by the timing converting means 220 Here, the test pattern providing means 235 does not necessarily measure the times in the test cycle at which the test pattern should be provided but may measure them on the time scale such that the time for one cycle is extended to one hundredfold.

The output signal storage means 240 receives the output signal outputted by the device simulator 300 according to the test pattern provided from the test pattern providing means 235 and stores therein the same. The comparison means 245 compares the output signal stored in the output signal storage means 240 with the expected value which is associated with the comparison timing and held at the comparison timing held in the converted expected value holding means 230. Specifically, the comparison means 245 compares the output signal with the expected value at the comparison timing converted by the timing converting means 220. Then the comparison means 245 outputs the output signal, the comparison timing and a comparison result indicative of whether the output signal corresponds to the expected value at the comparison timing to the margin determination means 250 The margin determination means 250 determines the size of the margin between which the output signal corresponds to the expected value when the output signal corresponds to the expected value at the comparison timing. Here, the size of the margin between which the output signal corresponds to the expected value may be the maximum value of magnitude of the change in an output condition in case that the output signal corresponds to the expected value even if the output condition such as an output timing or an output level is changed. Then the margin determination means 250 outputs the comparison timing and the size of the margin to the notification means 255.

The notification means 255 notifies the user that the margin is small at the comparison timing if the size of the margin determined by the margin determination means 250 is smaller than a predetermined reference value. When the size of the margin determined by the margin determination means 250 is smaller than a predetermined reference value, the notification means 255 may output information indicative of that effect. The signal display means 260 displays the output signal stored in the output signal storage means 240. The output signal display means 260 may notify the user by further displaying that the margin between which the output signal corresponds to the expected value is small at the comparison timing based on the information received from the notification means 255.

According to the test emulation system 10 of the embodiment of the present invention, when the margin between which the output signal corresponds to the expected value is smaller than the reference value even if the output signal corresponds to the expected value at the comparison timing, that effect can be notified users. Thereby such a trouble that the emulation test using the device simulator 300 is passed but the test of an actual semiconductor device using an actual semiconductor test apparatus is not passed at the same comparison timing because the output signal of the device simulator 300 is different from that of the actual semiconductor device can be prevented from occurring. Therefore, a highly accurate emulation test can be performed.

Additionally, according to the emulation system 10 of the embodiment of the invention, when the test pattern and the comparison timing is provided as the elapsed time from changing the previous test pattern and output signal, the elapsed time can be converted to the times in the test cycle as well as the actual test apparatus so that the test of the semiconductor device can be further accurately emulated.

Figure 2:
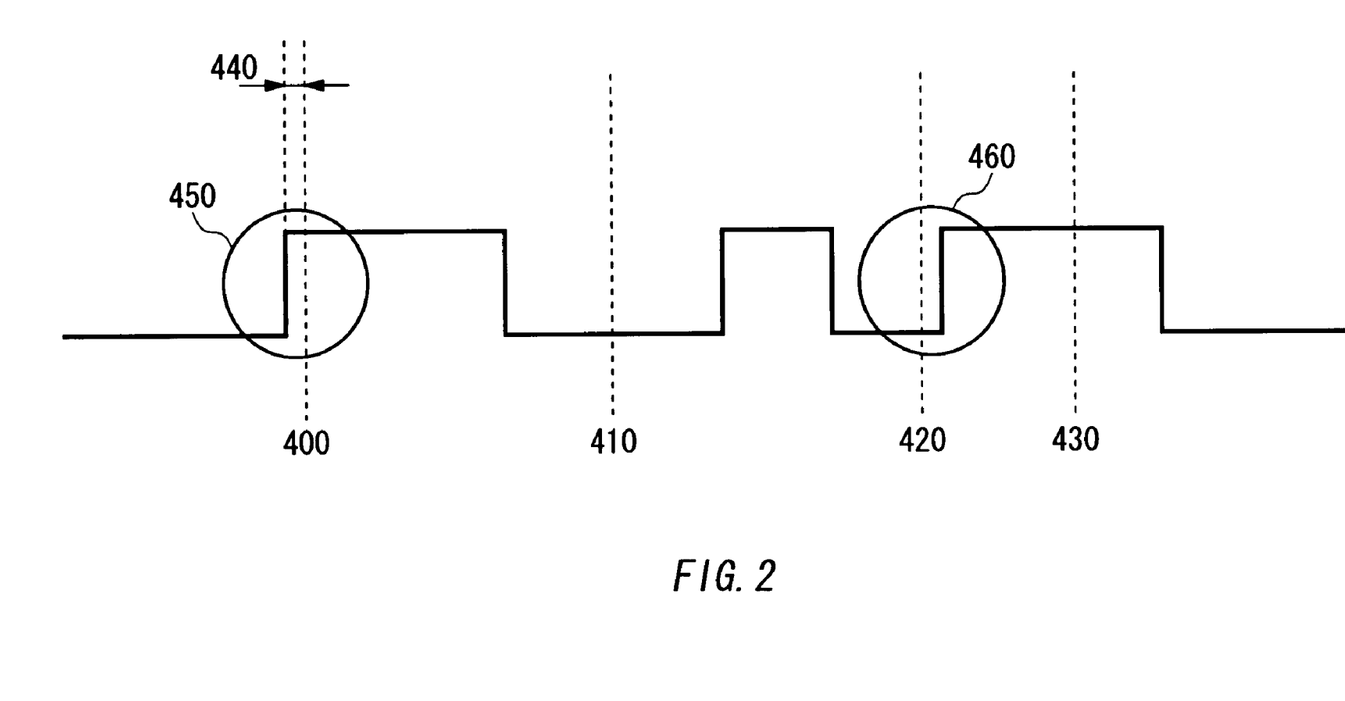
FIG. 2 is a drawing showing an example of output signals in a device simulator 300 according to an embodiment of the present invention.

FIG. 2 is an example of output signals in a device simulator 300 according to the embodiment of the present invention. The device simulator 300 outputs output signals as logical values based on the test pattern provided by the test pattern providing means 235 in the figure. However, the described matter hereinafter is not limited to only when the device simulator 300 outputs logical values but it can be applied when the device simulator outputs analog signals.

Firstly, the comparison means 245 compares the output signal stored in the output signal storage means 240 with the expected value at the comparison timing 400, such as H logic at the comparison timing 400. Then, the comparison means 245 determines the size of the margin between which the output signal is associated with the expected value centered around the comparison timing 400 when the output signal corresponds to the expected value at the comparison timing 400. For example, the margin determination means 250 may detect the periods between which the output signals correspond to the expected values before/after the comparison timing 400, respectively and determine that the length of the shorter period of the before/after periods is the size of the margin. Specifically, the margin determination means 250 may determine that a period 440 between the leading timing just before the comparison timing 400 and the comparison timing 400 is the size of the margin.

Additionally, the expected value storage means 215 may associate a plurality of comparison timings set by the timing setting means 205 with each expected value at the plurality of comparison timings and store therein the same. In this case, the comparison means 245 may compare the output signal with the expected value at each of the plurality of the comparison timings. Specifically, the comparison means 245 further compares output signals with expected values at a comparison timing 410, 420 and 430, respectively. Then, the margin determination means 250 determines the size of the margin between which the output signal corresponds to the expected value centered around each comparison timing when the output value corresponds to the expected value at each comparison timing.

Meanwhile, the output signal display means 260 may be a display device such as a liquid crystal panel provided in the test emulator 200. The output signal display means 260 displays the output signal shown as FIG. 2 to notify the user. Here, the notification means 255 may compare the size of the margin determined by the margin determination means 250 with a predetermined reference value at each comparison timing and indicate the comparison timing with a small margin on the output signal displayed on the output signal display means 260 to notify the user. Specifically, the notification means 255 may indicate a marker 450 and a marker 460 at portion matching to each comparison timing on the output signal when it is determined that the size of the margin is smaller than the reference value at the comparison timing 400 and 420 among the comparison timing 400-430 to notify the user of the comparison timing with a small margin. The predetermined reference value may be a value previously determined by the user based on the predicted value of the difference of timing at which logical values are inversed between the output signal of the device simulator 300 and that of the actual semiconductor device in order to sufficiently reduce the difference of the test results between the emulation test using the test emulator 200 and the test using the actual semiconductor test device. Additionally, the notification means 255 may notify the user of the predetermined number of comparison timings with the smallest margin among a plurality of comparison timings when margins smaller than the reference value are determined at the plurality of comparison timings.

According to the emulation system 10 of the embodiment of the present invention, if the size of the margin between the output signal corresponds to the expected value is not sufficiently large, that effect is notified the user to warn. Thereby the emulation test of the semiconductor device can be accurately performed using the test emulator 200 even if the timing at which the logical value is inversed is different between the output signal of the device simulator 300 and that of the actual semiconductor device.

Additionally, the comparison timing with a small margin is indicated on the output signal to notify the user so that the user can quickly know problems of the semiconductor device.

Further, when it is determined that margins are smaller than the reference value at a number of comparison timings, all of the timings always are not notified users but only the predetermined number such as ten of the comparison timings with a relatively small margin are notified the user so that the user can easily know points to preferentially notice. Thereby the user can effectively solve problems of the semiconductor device.

Incidentally, the operation of the test emulator 200 is not limited to the above-described matter. Various changes may be added to the operation. For example, the notification means 255 may use values different for each output terminal of the semiconductor device as the reference value for comparing with the size of the margin. Thereby the semiconductor device can be accurately tested using the test emulator 200 even if the required accuracy is different for each output terminal in the test of the semiconductor device.

Figure 3:
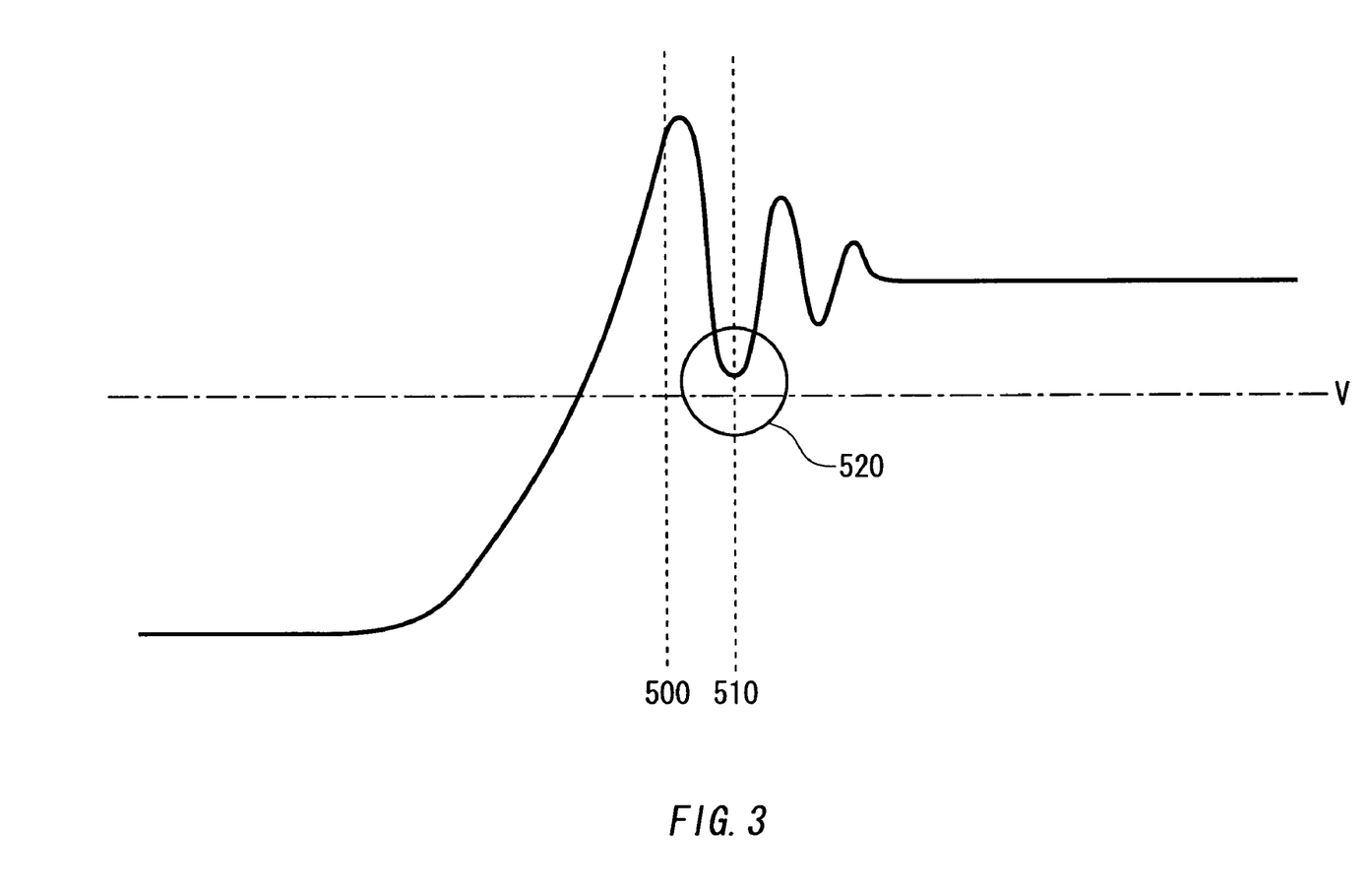
FIG. 3 is a drawing showing another example of output signals in a device simulator according to an embodiment of the present invention.

FIG. 3 shows another example of output signals in a device simulator 300 according to the embodiment of the present invention. The device simulator 300 outputs analog output signals according to the test pattern provided by the test pattern providing means 235 in FIG. 3. In the output signal shown in the figure, the level of the signal oscillates just after leading.

Firstly, the comparison means 245 compares the output signals stored in the output signal storage means 240 with a reference voltage V defined as the reference value at a comparison timing 500. Then, the margin determination means 250 determines the size of the margin between the level of the output signal and that of the reference voltage V at the comparison timing 500 upon the satisfaction of the condition that the output signal is more than the reference voltage defined as the expected value at the comparison timing 500. For example, the margin determination means 250 may determine the deference between the level of the output signal and that of the reference voltage V at the comparison timing 500 as the size of the margin. Additionally, the margin determination means 250 further may determine the deference between the level of the output signal and that of the reference voltage V at a timing 510 away from the comparison timing 500 by a predetermined period as the size of the margin.

Then, the notification means 255 compares the size of the margin determined by the margin determination means 250 with the predetermined reference value at the comparison timing 500 and the timing 510 away from the comparison timing 500 by the predetermined period, respectively. Additionally, the notification means 255 indicates a marker 520 on a portion matching to the timing 510 on the output signal displayed by the output signal display means 260 to notify the user of the timing with a small margin or the comparison timing when it is determined that the size of margin is smaller than the reference value at the timing 510. The predetermined reference value may be a value previously determined by the user based on the predicted value of the difference between the output signal level of device simulator and that of the actual semiconductor device in order to sufficiently reduce the difference between the result of the emulation test using the test emulator 200 and the result of the test using the actual semiconductor test apparatus.

For example, if the waveform of the output signal from the actual semiconductor device greatly oscillates just after leading in comparison with the waveform of the output signal simulated by the device simulator 300, the result of the emulation test using the test emulator 200 may be different from the result of the test using the actual semiconductor device. However, if the determination by the margin of the period centered around the comparison timing as FIG. 2 is only performed in the test emulation system 10, it is difficult to detect the above-described difference in each test result. Thus, according to the test emulator 200 of the embodiment of the present invention, when the margin between the output signal level and the reference voltage level is not sufficiently large, that effect can be notified the user to warn. Therefore, the emulation test of the semiconductor device can be accurately performed even if the waveform of the output signal from the actual semiconductor device greatly oscillates than the waveform simulated by the device simulator 300.

Further, the margin between the output signal level and the reference voltage level is determined before/after the comparison timing to notify the user of the portion with a small margin. Therefore, the emulation test of the semiconductor device can be accurately performed even if the period during which the output signal oscillates is relatively long.

Here, the operation of the test emulator 200 is not limited to the above-described matter. Various changes may be added to the operation. For example, the notification means 255 may use different values for each test period as the reference value for comparing with the size of margin if a plurality of test periods are included in one test. Thereby when the semiconductor device has a plurality of operation modes, one of which is a normal mode operated by the normal operating voltage and another of which is a low power consumption mode operated by lower operating voltage, the emulation test of the semiconductor device can be accurately performed by the test emulator 200 even if the required accuracy is different for each test period in the same output terminal of the semiconductor device.

Figure 4:
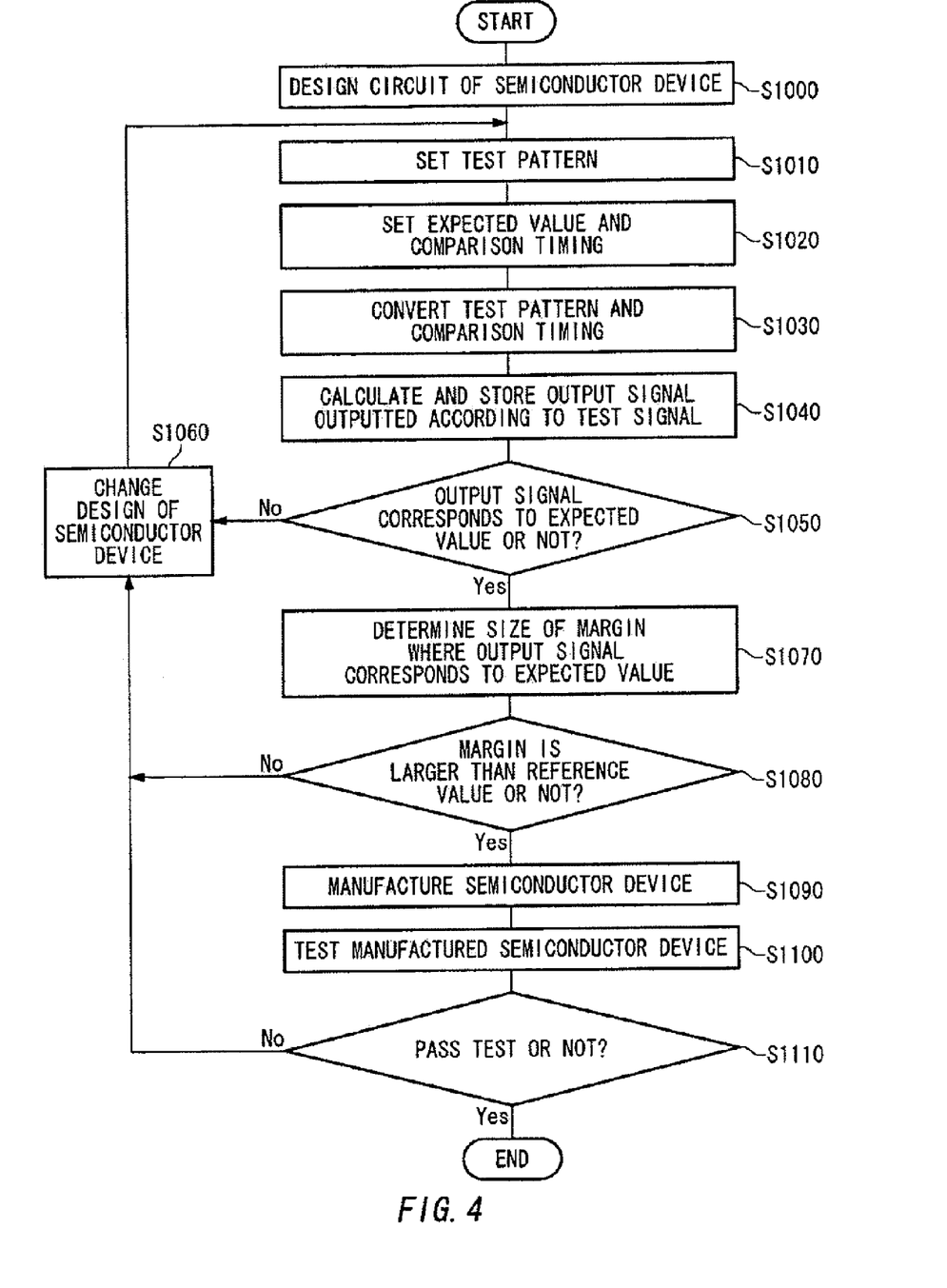
FIG. 4 is a flowchart showing an example of a method of manufacturing a semiconductor device using the test emulation system 10 according to an embodiment of the present invention.

FIG. 4 is a flowchart showing an example of a method of manufacturing a semiconductor device using the test emulation system 10 according to the embodiment of the present invention. In the method of manufacturing a semiconductor device represented in the present embodiment, a circuit design system for designing the circuit of the semiconductor device, a semiconductor device manufacturing system for manufacturing a semiconductor device based on the designed circuit and a semiconductor test apparatus for actually testing the manufactured semiconductor device other than the test emulation system 10. Incidentally, the circuit design system, the semiconductor device manufacturing system and the semiconductor test apparatus are well known technologies so that the detailed description is omitted.

Firstly, a user designs the circuit of a semiconductor device to be manufactured using hardware description language such as VHDL (S1000). Next, the timing setting means 205 sets a test pattern provided to the semiconductor device based on a test program made for the semiconductor device (S1010). Next, the timing setting means 205 associates a comparison timing for comparing the output signal obtained from the semiconductor device when the test pattern is supplied with a predetermined expected value with the expected value at the comparison timing based on the test program and sets it (S1020). Next, the timing converting means 220 converts times in the test pattern and the comparison timing set by the timing setting means 205 to times in the test cycle used when the actual semiconductor device is tested by the actual semiconductor test apparatus (S1030).

Next, the test emulator 200 causes a computer i.e. the device simulator 300 to simulate the operation of the designed semiconductor device while the test pattern is supplied to the semiconductor device simulated by the device simulator 300 using the test pattern providing means 235 to calculate the output signal to be outputted from the semiconductor device by the device simulator 300 and store the calculated output signal in the output storage means 240 (S1040). Next, the comparison means 245 compares the output signal stored in the output signal storage means 240 with the expected value at the comparison timing set by the timing setting means 205 and determines whether the output signal corresponds to the expected value (S1050). When the output signal does not correspond to the expected value (S1050: No), the user notified of that effect changes the design of the semiconductor device (S1060). Then, the test emulator 200 progresses the step to the S1010 and a test of the semiconductor device again based on the changed design.

Alternatively, if the output signal corresponds to the expected value (S1050: Yes), the margin determination means 250 determines the size of the margin between which the output signal corresponds to the expected value (S1070). Here, the notification means 255 determines whether the size of the margin determined by the margin determination means 250 is larger than a predetermined reference value (S1080). If it is determined that the size of the margin is smaller than the reference value (S1080: Yes), the notification means 255 notifies the user of that effect to cause the user to change the design of the semiconductor device (S1060).

Alternatively, if it is determined that the size of the margin is larger than the reference value by the notification means 255 (S1080: Yes), the semiconductor device manufacturing system manufactures the semiconductor device based on the circuit obtained in S1000 (S1090). Next, the semiconductor test apparatus provides the test pattern set in the S1020 or a test pattern approximately same as the test pattern set based on the test program and compares the output signal outputted from the semiconductor device with the expected value set in S1030 or the expected value approximately same as the expected value set based on the test program to test the semiconductor device (S1100). Here, the semiconductor test apparatus may compare the output signal with the expected value at frequency higher than the comparison timing with a large margin at the comparison timing with a small margin determined by the margin determination means 250 in comparison with the processing in S1050. Next, the semiconductor test apparatus determines whether the semiconductor device has passed the test (S1110). If the semiconductor device has not passed the test (S1110: No), the semiconductor test apparatus progresses the step to S1060 and causes the user to change the design of the semiconductor device. Alternatively, the semiconductor device has passed the test (S1110: Yes), the manufacture of the semiconductor device is completed.

According to the method of manufacturing a semiconductor device of the embodiment of the present invention, defects of the design of the semiconductor device can be accurately detected in the emulation test by the test emulator 200 even if the output signal from the device simulator 300 is different from the output signal from the actual semiconductor device. Thereby when a semiconductor device is actually manufactured and tested by the semiconductor test apparatus, the frequency of occurrence of redesign step because any defect of the design of the semiconductor device is found is reduced so that the semiconductor device can be further effectively manufactured at low cost.

Additionally, when the manufactured semiconductor device is tested by the semiconductor test apparatus, the output signal is compared with the expected value at higher frequency at the comparison timing with a relatively small margin detected in the simulated test by the test emulator 200. Therefore the critical portion in the circuit design of the semiconductor device can be further accurately tested so that the quality of the semiconductor device to be manufactured can be improved.

Figure 5:
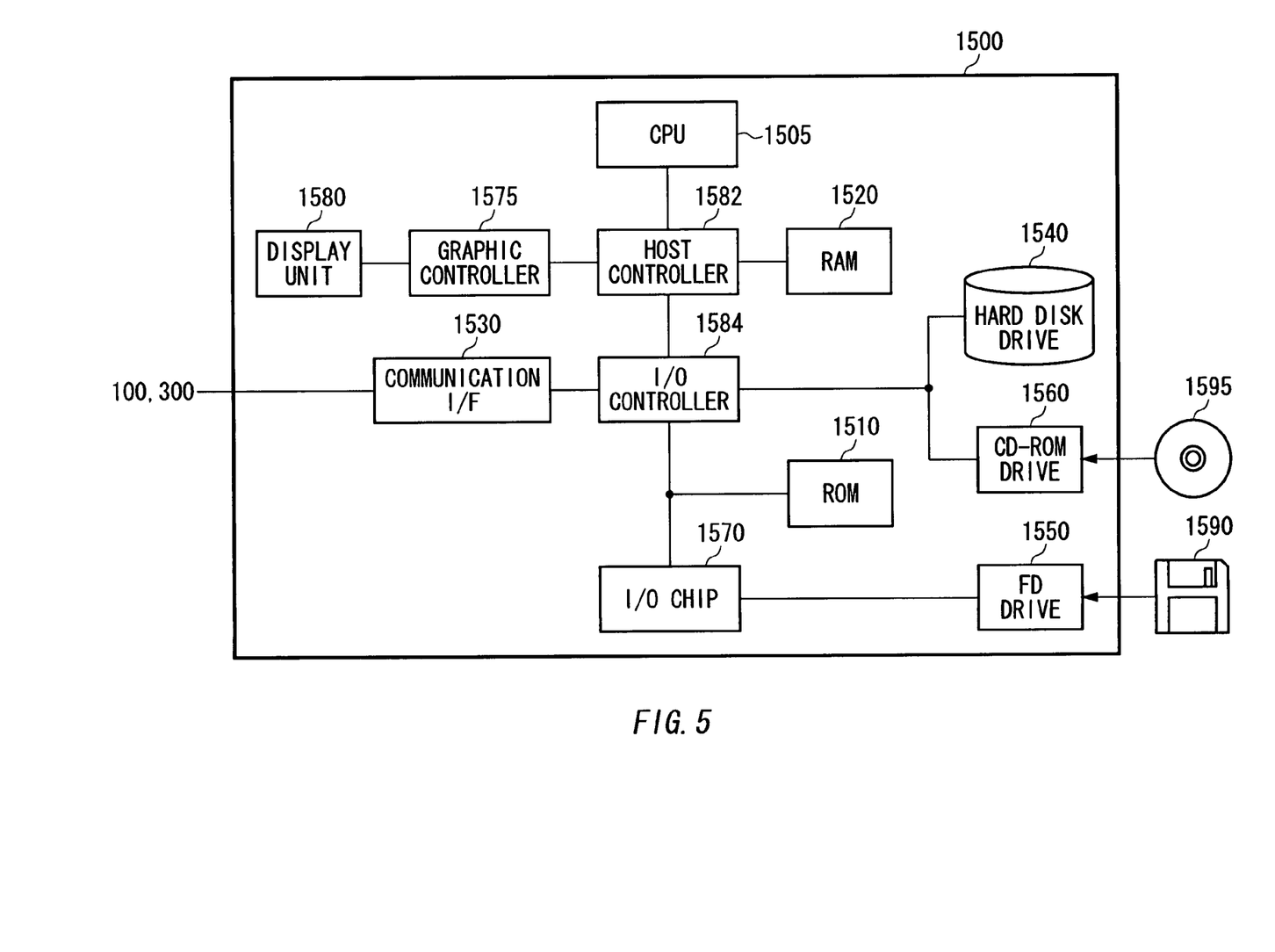
FIG. 5 is a block diagram showing an example of the hardware configuration of a computer 1500 according to an embodiment of the present invention.

FIG. 5 is a block diagram showing an example of the hardware configuration of a computer 1500 according to the embodiment of the present invention. A computer 1500 according to the embodiment of the present invention includes a periphery of CPU having a CPU 1505, a RAM 1520, a graphic controller 1575 and a display unit 1580 interconnected by a host controller 1582, an input-output unit having a communication interface 1530, a hard disk drive 1540 and a CD-ROM drive 1560 connected to the host controller 1582 via an input-output controller 1584, and a legacy input-output unit having a ROM 1510, a flexible disk drive 1550 and an input-output chip 1570 connected to the input-output controller 1584.

The host controller 1582 connects the RAM 1520 to the CPU 1505 and the graphic controller 1575 accessing the RAM 1520 at high transfer rate. The CPU 1505 operates based on the program stored in the ROM 1510 and the RAM 1520 to control each unit. The graphic controller 1575 acquires image data generated on a frame buffer which is provided in the RAM 1520 by the CPU 1505 to display it on the display unit 1580. Alternatively, the graphic controller 1575 may include the frame buffer for storing the image data generated by the CPU 1505 therein.

The input-output controller 1584 connects the host controller 1582 to the communication interface 1530 which is relatively high-speed input-output unit, the hard disk drive 1540 and the CD-ROM drive 1560. The communication interface 1530 communicates with the test emulator control unit 100, the device simulator 300 and the other units through a network. The hard disk drive 1540 stores programs and data used for the CPU 1505 in the computer 1500. The CD-ROM drive 1560 reads programs or data from the CD-ROM 1595 and provides it to the hard disk drive through the RAM 1520.

The ROM 1510 and a relatively low-speed input-output unit for the flexible disk drive 1550 and the input-output chip 1570 are connected to the input-output controller 1584. The ROM 1510 stores a boot program operated at which the computer 1500 is booted and a program dependent on the hardware of the computer 1500. The flexible disk drive 1550 reads programs or data from the flexible disk 1590 and provides it to the hard disk drive 1540 through the RAM 1520. The input-output chip 1570 connects the flexible disk drive 1550 and various input-output units through such as a parallel port, a serial port, keyboard port and a mouse port.

The emulation program provided to the hard disk drive 1540 through the RAM 1520 is stored on a storage medium such as a flexible disk 1590, a CD-ROM 1595 or an IC card and then provided by users. The emulation program is read from the storage medium, installed into the hard disk drive 1540 in the computer 1500 through the RAM and executed by the CPU 1505. The emulation program installed and executed in the computer 1500 acts on the CPU 1505 to operate the computer 1500 to function as the test emulator which has been described in FIG. 1-FIG. 4.

The described above programs may be stored in an external storage medium. As the storage medium other than the flexible disk 1590 and the CD-ROM 1595, optical recording medium such as a DVD and a PD, magneto-optical recording medium such as a MD, tape medium and a semiconductor memory such as an IC card can be used. Additionally, a storage unit such as a hard disk or a RAM which is provided on a server system connected to a dedicated communication network or Internet may be used as the storage medium to provide programs to the computer 1500 through the network.

While the present invention have been described with the embodiment, the technical scope of the invention not limited to the above described embodiment. Various alternations and improvements can be added to the above-described embodiment. It is apparent from the scope of the claims that the embodiment added such alternation or improvements can be included in the technical scope of the invention.

According to the present invention as thus described above, highly accurate emulation tests can be performed using the simulated semiconductor device.

What is claimed is:

1. A test emulator for emulating a test of a semiconductor device, comprising:
   a test pattern providing means for providing a test pattern to a device simulator which simulates the operation of the semiconductor device;
   an expected value storage means for associating a comparison timing with a predetermined expected value and storing therein the comparison timing and the expected value, the comparison timing being a time point at which an output signal outputted from the device simulator according to the test pattern is compared with the expected value;

a margin determination means for determining the size of a margin, after a comparison is made at the comparison timing between the output signal and the corresponding expected value, the margin representing a period during which the output signal coincides with the expected value; and a notification means for notifying a user that the margin at the comparison timing is small when the size of the margin is smaller than a reference value.

2. The test emulator according to claim 1, wherein the period is defined to begin or end the comparison timing.

3. The test emulator according to claim 2, wherein the expected value storage means associates a plurality of comparison timings with each expected value at the plurality of comparison timings, respectively and stores therein the same, and the notification means notifies the user of the predetermined number of comparison timings with the smallest margin.

4. The test emulator according to claim 1, wherein the margin determination means determines the size of the margin between a level of the output signal and a reference voltage level defined as the expected value at the comparison timing.

5. The test emulator according to claim 1, wherein the margin determination means determines the size of the margin between a level of the output signal and a reference voltage level defined as the expected value at a timing away from the comparison timing by a predetermined period.

6. The test emulator according to claim 1, wherein the notification means uses different values for each output terminal of the semiconductor device as the reference value.

7. The test emulator according to claim 1, wherein the notification means uses different values for each test period as the reference value.

8. The test emulator according to claim 1 further comprises an output signal display means for displaying the output signal, wherein the notification means indicates the comparison timing with a small margin on the output signal displayed on the output signal display means.

9. The test emulator according to claim 1 further comprises:

a timing setting means for setting the test pattern and the comparison timing as an elapsed time from changing the test pattern and the output signal; and a timing converting means for converting the elapsed time from the change to times in each test cycle used when an actual semiconductor device is tested using an actual semiconductor test apparatus, wherein the test pattern providing means provides the test pattern at the time in the test cycle converted by the timing converting means, and the margin determination means determines the size of the margin when the output signal corresponds to the expected value at the comparison timing converted by the timing converting means.

10. An emulation program, wherein the emulation program is stored on a computer-readable medium and is executed by a computer system, for operating a computer to function as a test emulator which emulates a test of a semiconductor device, the test emulator comprising:

a test pattern providing means for providing a test pattern to a device simulator which simulates the operation of the semiconductor device;

an expected value storage means for associating a comparison timing with a predetermined expected value and storing therein the comparison timing and expected value, the comparison timing being a time point at which an output signal outputted from the device simulator according to the test pattern is compared with the expected value;

a margin determination means for determining the size of a margin, after a comparison is made at the comparison timing between the output signal and the corresponding expected value, the margin representing a period during which the output signal coincides with the expected value; and a notification means for notifying a user that the margin at the comparison timing is small when the size of the margin is smaller than a reference value.

11. The emulation program according to claim 10, wherein the period is defined to begin or end at the comparison timing.

12. The emulation program according to claim 11, wherein the expected value storage means associates a plurality of comparison timings with each expected value at the plurality of comparison timings, respectively and stores therein the same, and the notification means notifies the user of the predetermined number of comparison timings with the smallest margin.

13. The emulation program according to claim 10, wherein the margin determination means determines the size of the margin between a level of the output signal and a reference voltage level defined as the expected value at the comparison timing.

14. The emulation program according to claim 10, wherein the margin determination means determines the size of the margin between a level of the output signal and a reference voltage level defined as the expected value at a timing away from the comparison timing by a predetermined period.

15. The emulation program according to claim 10, wherein the notification means uses different values for output terminals of the semiconductor device as the reference value.

16. The emulation program according to claim 10, wherein the notification means uses different values for each test period as the reference value.

17. The emulation program according to claim 10 further comprises an output signal display means for displaying the output signal, wherein the notification means indicates the comparison timing with a small margin on the output signal displayed on the output signal display means.

* * * * *